United States Patent
Kim

(10) Patent No.: US 12,394,738 B2
(45) Date of Patent: Aug. 19, 2025

(54) SEMICONDUCTOR PACKAGE

(71) Applicant: Samsung Electronics Co., Ltd., Suwon-si (KR)

(72) Inventor: Young Lyong Kim, Anyang-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 106 days.

(21) Appl. No.: 17/163,401

(22) Filed: Jan. 30, 2021

(65) Prior Publication Data

US 2022/0013487 A1   Jan. 13, 2022

(30) Foreign Application Priority Data

Jul. 13, 2020   (KR) .................. 10-2020-0086265

(51) Int. Cl.
    *H01L 23/00*    (2006.01)
    *H01L 23/16*    (2006.01)
    *H01L 23/31*    (2006.01)

(52) U.S. Cl.
    CPC ............. *H01L 24/13* (2013.01); *H01L 23/16* (2013.01); *H01L 23/3128* (2013.01); *H01L 24/29* (2013.01); *H01L 24/32* (2013.01); *H01L 24/73* (2013.01); *H01L 24/97* (2013.01); *H01L 2224/0401* (2013.01); *H01L 2224/32225* (2013.01); *H01L 2224/73204* (2013.01); *H01L 2924/3511* (2013.01)

(58) Field of Classification Search
    CPC ....... H01L 23/16; H01L 23/18; H01L 23/562; H01L 23/04; H01L 23/5389
    See application file for complete search history.

(56) References Cited

U.S. PATENT DOCUMENTS

| | | |
|---|---|---|
| 7,045,390 B2 | 5/2006 | Milla et al. |
| 7,211,889 B2 | 5/2007 | Shim |
| 7,224,057 B2 | 5/2007 | Yang |
| 7,585,702 B1 | 9/2009 | Wang et al. |
| 7,741,160 B1 | 6/2010 | Wang et al. |
| 8,115,303 B2 | 2/2012 | Bezama et al. |
| 8,212,353 B1 | 7/2012 | Wang et al. |
| 8,772,927 B2 | 7/2014 | Bezama et al. |
| 8,976,529 B2 | 3/2015 | Lin et al. |

(Continued)

FOREIGN PATENT DOCUMENTS

| | | | | |
|---|---|---|---|---|
| EP | 3462487 A1 | * | 4/2019 | ....... H01L 21/02227 |
| JP | 2000-323624 | | 11/2000 | |

(Continued)

OTHER PUBLICATIONS

Office Action in Korean Appln. No. 10-2020-0086265, mailed on Nov. 1, 2024, 20 pages (with English translation).

*Primary Examiner* — Wael M Fahmy
*Assistant Examiner* — Quinton A Brasfield
(74) *Attorney, Agent, or Firm* — Fish & Richardson P.C.

(57) ABSTRACT

Disclosed is a semiconductor package comprising a package substrate, a substrate on the package substrate, a first semiconductor chip mounted on the substrate, and a stiffener structure on the package substrate and having a hole. The stiffener structure is laterally spaced apart from the substrate. The hole penetrates a top surface of the stiffener structure and a bottom surface of the stiffener structure. When viewed in plan, the hole overlaps a corner region of the package substrate.

19 Claims, 12 Drawing Sheets

(56) References Cited

U.S. PATENT DOCUMENTS

| | | | |
|---|---|---|---|
| 10,153,222 | B2 | 12/2018 | Yu et al. |
| 10,475,750 | B2 | 11/2019 | Nair et al. |
| 10,522,477 | B2 | 12/2019 | Chen |
| 10,600,706 | B2 | 3/2020 | Lee |
| 2003/0030140 | A1* | 2/2003 | Shim ................ H01L 23/49833 257/E23.101 |
| 2007/0075394 | A1 | 4/2007 | Gogoi |
| 2007/0075445 | A1 | 4/2007 | Gogoi |
| 2009/0126981 | A1* | 5/2009 | Horiuchi ................ H01L 23/16 174/262 |
| 2010/0208442 | A1* | 8/2010 | Asano ............... H01L 23/49822 361/783 |
| 2016/0095209 | A1* | 3/2016 | Starkston ................ H01L 24/97 361/767 |
| 2018/0233459 | A1 | 8/2018 | Fushimi |
| 2018/0261554 | A1* | 9/2018 | Huang ................ H01L 23/562 |
| 2019/0006333 | A1* | 1/2019 | Ong ........................ H01L 25/16 |
| 2019/0115269 | A1 | 4/2019 | Pan et al. |
| 2020/0105642 | A1 | 4/2020 | Gandhi et al. |
| 2021/0151388 | A1* | 5/2021 | Choi ................ H01L 23/49838 |
| 2021/0366889 | A1* | 11/2021 | Lin ........................ H01L 25/18 |

FOREIGN PATENT DOCUMENTS

| | | |
|---|---|---|
| JP | 2019-169559 | 10/2019 |
| KR | 10-2003-0013737 | 2/2003 |
| KR | 10-2018-0054440 | 5/2018 |
| TW | 200715404 | 4/2007 |
| TW | 200717774 | 5/2007 |

\* cited by examiner

US 12,394,738 B2

SEMICONDUCTOR PACKAGE

CROSS-REFERENCE TO RELATED APPLICATION

This U.S. nonprovisional application claims priority under 35 U.S.C § 119 to Korean Patent Application No. 10-2020-0086265, filed on Jul. 13, 2020, in the Korean Intellectual Property Office, the disclosure of which is hereby incorporated by reference in its entirety.

BACKGROUND

The present inventive concepts relate to a semiconductor package, and more particularly, to a semiconductor package including a stiffener structure.

A semiconductor package is provided to implement an integrated circuit chip for use in electronic products. Typically, a semiconductor package is configured such that a semiconductor chip is mounted on a printed circuit board (PCB) and bonding wires or bumps are used to electrically connect the semiconductor chip to the printed circuit board. With the development of electronic industry, various research has been conducted to improve reliability and durability of semiconductor packages.

SUMMARY

Some example embodiments of the present inventive concepts provide a semiconductor package with increased reliability.

According to some example embodiments of the present inventive concepts, a semiconductor package may comprise: a package substrate; a substrate on the package substrate; a first semiconductor chip mounted on the substrate; and a stiffener structure on the package substrate, the stiffener structure having a hole. The stiffener structure may be laterally spaced apart from the substrate. The hole may penetrate a top surface of the stiffener structure and a bottom surface of the stiffener structure. When viewed in plan, the hole may overlap a corner region of the package substrate.

According to some example embodiments of the present inventive concepts, a semiconductor package may comprise: a package substrate having a first region and a second region that surrounds the first region, when viewed in plan; a first semiconductor chip on the first region of the package substrate; a stiffener structure on the second region of the package substrate, the stiffener structure having a hole; and an adhesive layer between the package substrate and the stiffener structure. The hole may penetrate a top surface of the stiffener structure and a bottom surface of the stiffener structure. The adhesive layer may extend into the hole of the stiffener structure.

According to some example embodiments of the present inventive concepts, a semiconductor package may comprise: a package substrate that has a central region, a first edge region, and a second edge region; an interposer substrate on a top surface of the central region of the package substrate; a plurality of interposer bumps between the package substrate and the interposer substrate; an under-fill layer in a gap between the package substrate and the interposer substrate, the under-fill layer encapsulating the interposer bumps; a first semiconductor chip mounted on a top surface of the interposer substrate; a plurality of first bumps between the interposer substrate and the first semiconductor chip; a chip stack mounted on the top surface of the interposer substrate and spaced apart from the first semiconductor chip, the chip stack including a plurality of stacked second semiconductor chips; a plurality of second bumps between the second semiconductor chips; a stiffener structure on the top surface of the first and second edge regions of the package substrate, the stiffener structure having a hole; and an adhesive layer between the package substrate and a bottom surface of the stiffener structure. The hole may penetrate a top surface of the stiffener structure and the bottom surface of the stiffener structure. The hole may be on the first edge region of the package substrate. The first edge region of the package substrate may be adjacent to a corner where two neighboring side surfaces of the package substrate meet each other.

DETAILED DESCRIPTION OF EMBODIMENTS

Figure 1A:
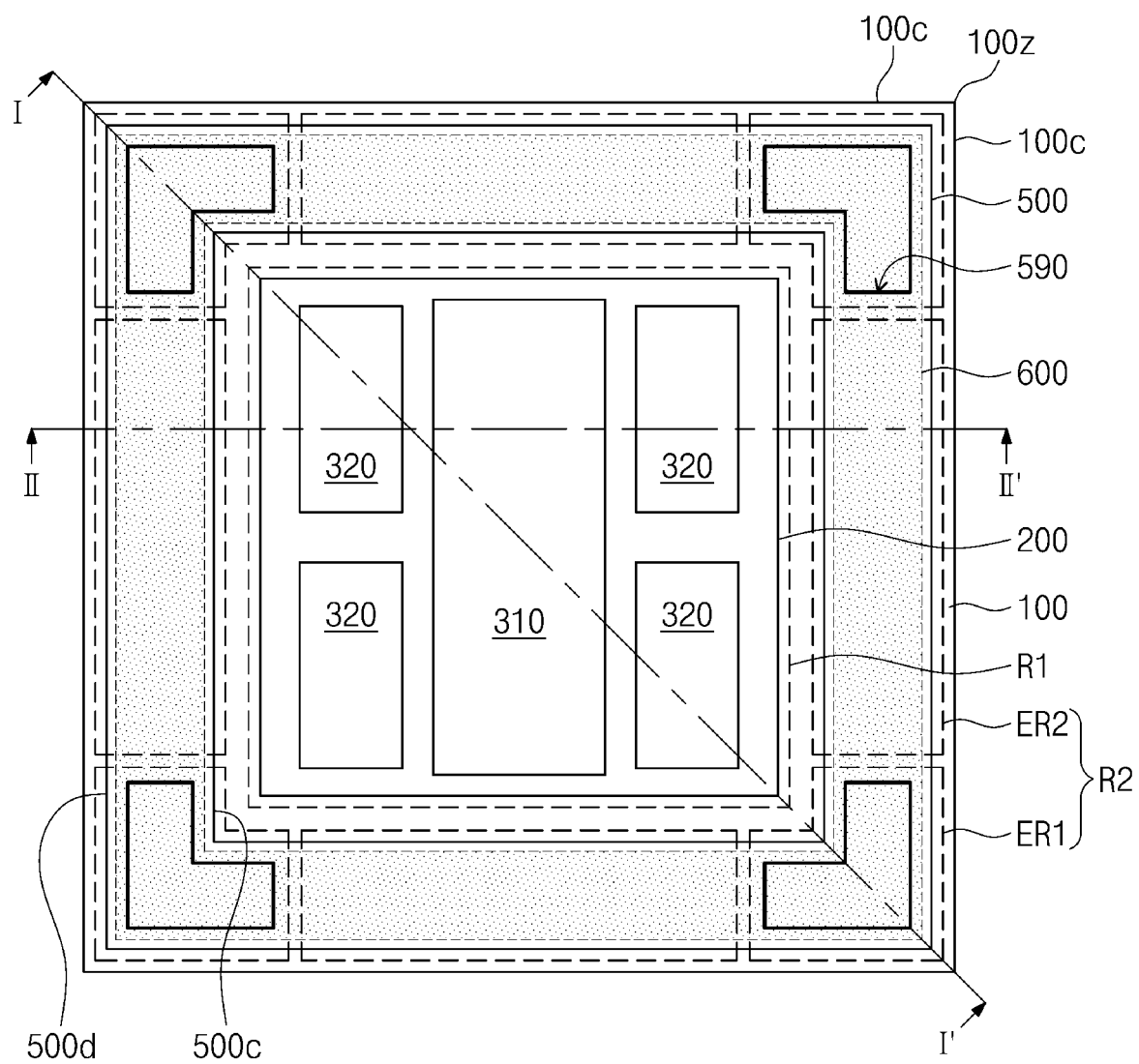
FIG. 1A illustrates a plan view showing a semiconductor package, according to, example embodiments.

In this description, like reference numerals indicate like components. The following will now describe a semiconductor package and its fabrication method according to the present inventive concepts.

Figure 1B:
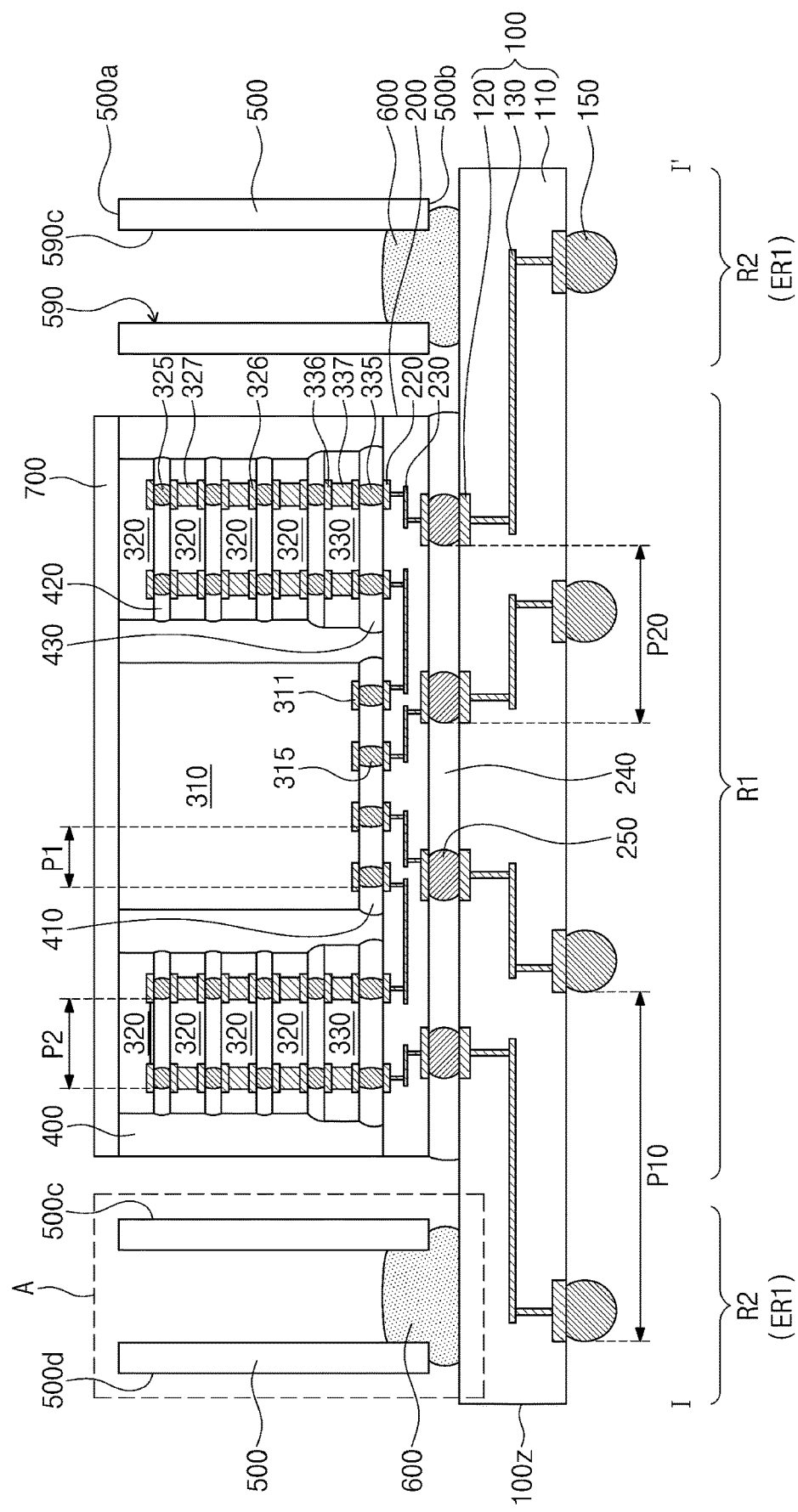
FIG. 1B illustrates a cross-sectional view taken along line IT of FIG. 1A.
Figure 1C:
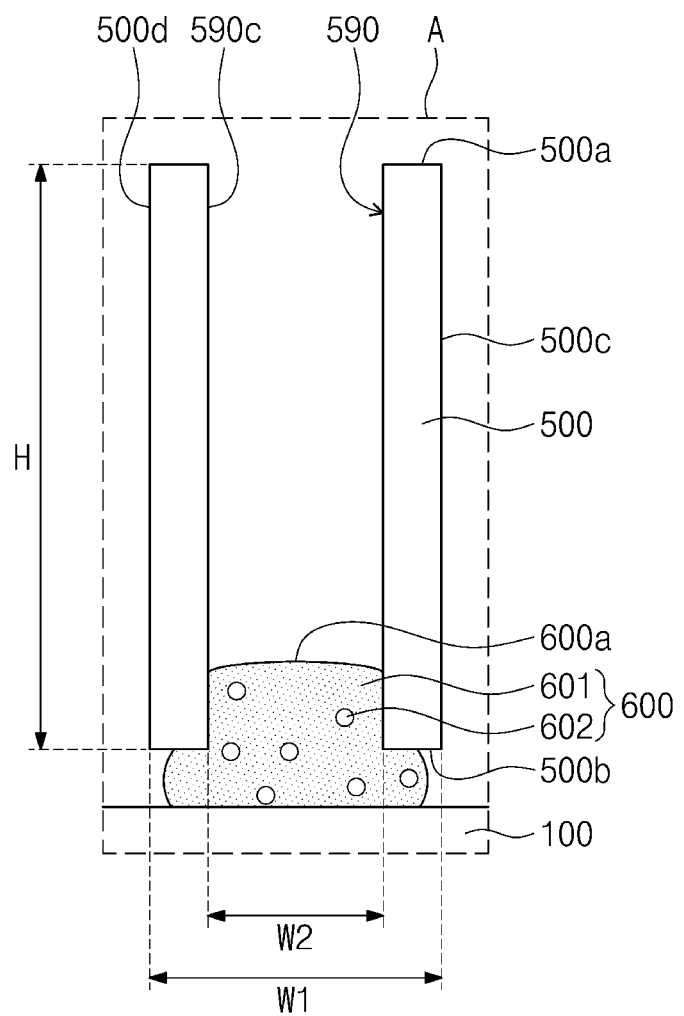
FIG. 1C illustrates an enlarged view showing section A of FIG. 1B.
Figure 1D:
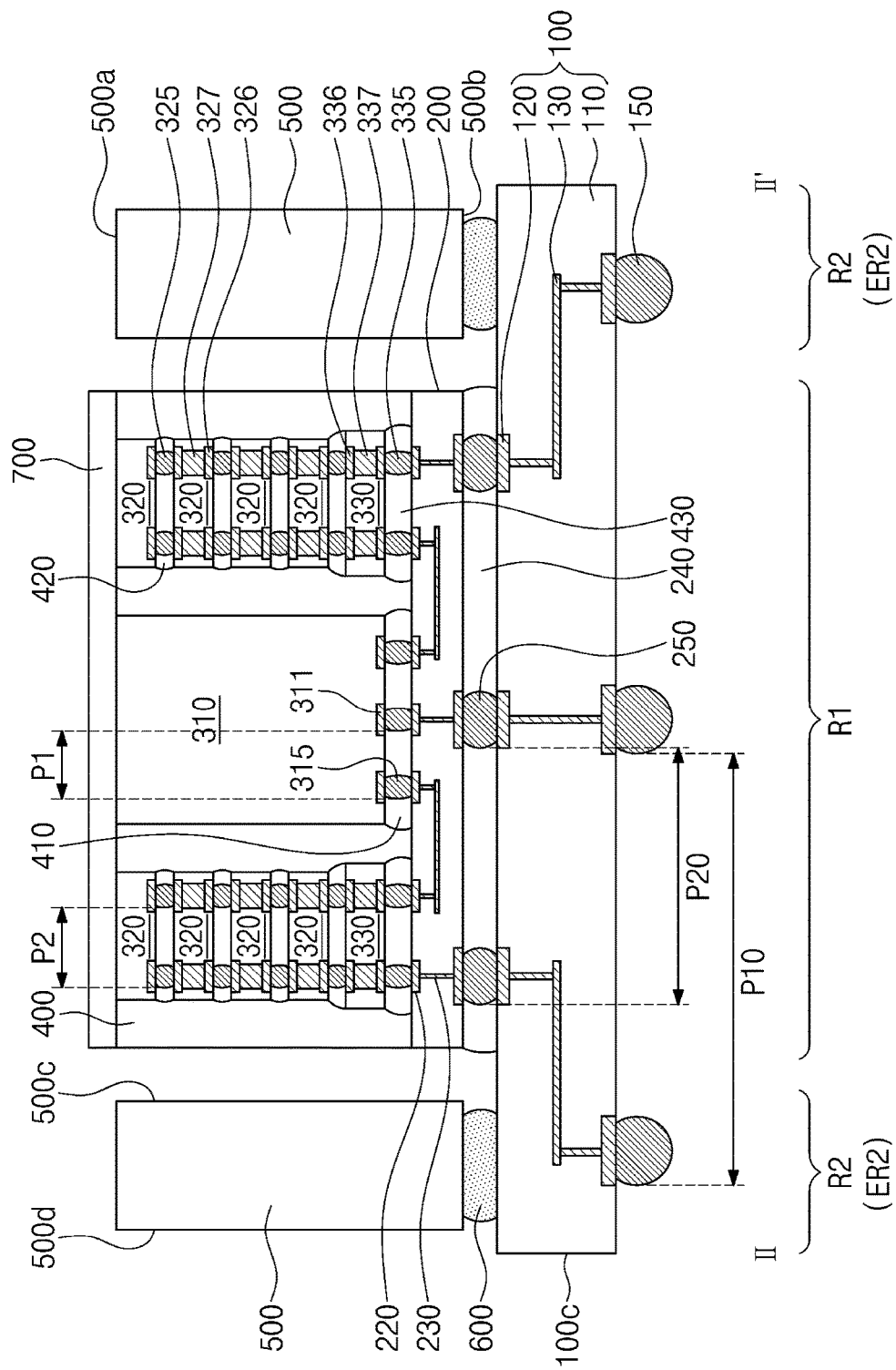
FIG. 1D illustrates a cross-sectional view taken along line II-IF of FIG. 1A.

FIG. 1A illustrates a plan view showing a semiconductor package, according to example embodiments. FIG. 1B illustrates a cross-sectional view taken along line IT of FIG. 1A. FIG. 1C illustrates an enlarged view showing section A of FIG. 1B. FIG. 1D illustrates a cross-sectional view taken along line II-IF of FIG. 1A.

Referring to FIGS. 1A, 1B, 1C, and 1C, a semiconductor package may include a package substrate 100, a first semiconductor chip 310, a stiffener structure 500, and an adhesive layer 600. The semiconductor package may further include at least one selected from an external terminal 150, an interposer substrate 200, interposer bumps 250, an under-fill layer 240, second semiconductor chips 320, third semiconductor chips 330, and a molding layer 400.

When viewed in plan as shown in FIG. 1A, the package substrate 100 may include a first region R1 and a second region R2. The first region R1 may be a central region of the package substrate 100. The second region R2 may be an edge region of the package substrate 100. The second region R2 may be spaced apart from the first region R1. When viewed in plan, the second region R2 may surround the first region R1. The second region R2 may be interposed between the first region R1 and side surfaces 100c of the package substrate 100. The second region R2 may include first edge regions ER1 and second edge regions ER2. The first edge regions ER1 may correspond to corner regions of the package substrate 100. For example, each of the first edge regions ER1 may be adjacent to a corner 100z where two adjacent side surfaces 100c of the package substrate 100 meet each other. Each of the second edge regions ER2 of the package substrate 100 may be provided between two of the first edge regions ER1 and adjacent to one of the side surfaces 100c of the package substrate 100.

As shown in FIGS. 1B and 1D, the package substrate 100 may include a dielectric base layer 110, a substrate pad 120, and an internal line 130. The dielectric base layer 110 may include a plurality of stacked layers. Alternatively, the dielectric base layer 110 may be a single layer. The substrate pad 120 may be exposed on a top surface of the package substrate 100. For example, a top surface of the substrate pad 120 may be coplanar with the top surface of the package substrate 100. The internal line 130 may be disposed in the dielectric base layer 110 and coupled to the substrate pad 120. The phrase "two components are electrically connected/coupled to each other" may include that the two components are connected/coupled either directly to each other or indirectly to each other through a different conductive component. In this description, the phrase "electrically connected/coupled to the package substrate 100" may indicate the meaning of "electrically connected/coupled to the internal line 130." The substrate pad 120 and the internal line 130 may include metal, such as one or more of copper, aluminum, tungsten, and titanium. For example, the package substrate 100 may be a printed circuit board (PCB) having a circuit pattern. For another example, a redistribution layer may be used as the package substrate 100.

The external terminal 150 may be provided on a bottom surface of the package substrate 100 and coupled to the internal line 130. External electrical signals may be transmitted through the external terminal 150 to the internal line 130. The external terminal 150 may include a solder ball. The external terminal 150 may include metal, such as a solder material. The solder material may include tin (Sn), silver (Ag), zinc (Zn), or any alloy thereof.

A substrate may be disposed on the first region R1 of the package substrate 100. The substrate may be the interposer substrate 200. The interposer substrate 200 may include a metal pad 220 and a metal line 230. The metal pad 220 may be exposed on a top surface of the interposer substrate 200. For example, a top surface of the metal pad 220 may be coplanar with the top surface of the interposer substrate 200. The metal line 230 may be provided in the interposer substrate 200 and coupled to the metal pad 220. In this description, the phrase "electrically connected/coupled to the interposer substrate 200" may indicate the meaning of "electrically connected/coupled to the metal line 230." The metal pad 220 and the metal line 230 may include metal, such as one or more of copper, aluminum, tungsten, and titanium.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

The interposer bump 250 may be interposed between and coupled to the package substrate 100 and the interposer substrate 200. For example, the interposer bump 250 may be coupled to the substrate pad 120 and the metal line 230. In example embodiments, the interposer bump 250 may directly contact (i.e., touch) the top surface of the substrate pad 120. The interposer bump 250 may include one or more of a solder ball, a bump, and a pillar. The interposer bump 250 may include metal, such as a solder material. The under-fill layer 240 may be disposed on the first region R1 of the package substrate 100. The under-fill layer 240 may be provided in a gap between the package substrate 100 and the interposer substrate 200, thereby encapsulating the interposer bumps 250. The under-fill layer 240 may include a dielectric polymer, such as an epoxy-based polymer.

The first semiconductor chip 310 may be provided on the top surface of the first region R1 of the package substrate 100. In this description, the phrase "a certain component is on other component" may mean that "the certain component is directly formed on the other component" or "a third component is interposed between the certain component and the other component." For example, the interposer substrate 200 may be interposed between the package substrate 100 and the first semiconductor chip 310. The first semiconductor chip 310 may be disposed on the top surface of the interposer substrate 200. The first semiconductor chip 310 may include a logic chip, a buffer chip, or a system-on-chip (SOC). The first semiconductor chip 310 may be, for example, an application specific integrated circuit (ASIC) chip or an application processor (AP) chip. The ASIC chip may include an application specific integrated circuit (ASIC). The first semiconductor chip 310 may include a central processing unit (CPU) or a graphic processing unit (GPU).

A first bump 315 may be interposed between and electrically connect the interposer substrate 200 and the first semiconductor chip 310. In this description, the phrase "electrically connected to a semiconductor chip" may mean that "electrically connected to integrated circuits in the semiconductor chip." For example, the first bump 315 may be coupled to a chip pad 311 of the first semiconductor chip 310 and to a corresponding metal pad 220. In example embodiments, the first bump 315 may contact a bottom surface of the chip pad 311 and the top surface of the corresponding metal pad 220. The first bump 315 may include a conductive material, such as a solder material. The first bump 315 may be provided in plural. A pitch P1 of the first bumps 315 may be less than a pitch P20 of a plurality of interposer bumps 250. The pitch P1 of the first bumps 315 may be less than a pitch P10 of a plurality of external terminals 150. The pitch P20 of the plurality of interposer bumps 250 may be less than the pitch P10 of the plurality of external terminals 150.

A first under-fill pattern 410 may be provided in a first gap between the interposer substrate 200 and the first semiconductor chip 310, thereby encapsulating the first bumps 315. The first under-fill pattern 410 may include a dielectric polymer, such as an epoxy-based polymer.

The second semiconductor chip 320 may be provided on the top surface of the first region R1 of the package substrate 100. For example, the second semiconductor chip 320 may be disposed on the top surface of the interposer substrate 200. The second semiconductor chip 320 may be provided in plural, and the plurality of second semiconductor chips 320 may be stacked on the top surface of the interposer substrate 200. The second semiconductor chips 320 may be of different type from the first semiconductor chip 310. The second semiconductor chips 320 may be memory chips. The memory chips may include high bandwidth memory (HBM) chips. The second semiconductor chips 320 may include dynamic random memory (DRAM) chips.

Each of the second semiconductor chips 320 may include integrated circuits (not shown), chip connection pads 326, and through structures 327. The integrated circuits may be provided in the second semiconductor chip 320. The through structures 327 may penetrate a corresponding second semiconductor chip 320 and may have electrical connection with the integrated circuits. In contrast, an uppermost second semiconductor chip 320 may not include the through structure 327.

The third semiconductor chip 330 may be interposed between the interposer substrate 200 and a lowermost second semiconductor chip 320. The third semiconductor chip 330 may be of different type from the first semiconductor chip 310 and the second semiconductor chips 320. For example, the third semiconductor chip 330 may be a logic chip, and may have a different function from that of the first semiconductor chip 310. The third semiconductor chip 330 may have a width different from that of the second semiconductor chip 320, but the present inventive concepts are not limited thereto. The third semiconductor chip 330 may include integrated circuits (not shown), conductive chip pads 336, and through vias 337. The integrated circuits may be provided in the third semiconductor chip 330. The through vias 337 may penetrate the third semiconductor chip 330 and may have electrical connection with the integrated circuits of the third semiconductor chip 330. The second semiconductor chips 320 and the third semiconductor chip 330 may constitute a chip stack. Differently from that shown, the third semiconductor chip 330 may be omitted.

A plurality of second bumps 325 may be interposed between two neighboring second semiconductor chips 320. The second bumps 325 may have electrical connection with the through structures 327 and/or the integrated circuits of a corresponding second semiconductor chip 320. The second semiconductor chips 320 may be electrically connected to each other through the second bumps 325. The second bumps 325 may further be interposed between the third semiconductor chip 330 and the lowermost second semiconductor chip 320. The second semiconductor chips 320 may be electrically connected through the second bumps 325 to the third semiconductor chip 330. The second bumps 325 may include a conductive material, such as a solder material. A pitch P2 of the second bumps 325 may be less than the pitch P20 of the interposer bumps 250. The pitch P2 of the second bumps 325 may be less than the pitch P10 of the external terminals 150. A plurality of second under-fill patterns 420 may be provided in second gaps between the second semiconductor chips 320 and a third gap between the third semiconductor chip 330 and the lowermost second semiconductor chip 320. Each of the second under-fill patterns 420 may encapsulate corresponding second bumps 325. The second under-fill pattern 420 may include a dielectric polymer, such as an epoxy-based polymer.

A third bump 335 may be interposed between and electrically connect the interposer substrate 200 and the third semiconductor chip 330. The third bump 335 may include a conductive material, such as a solder material. Therefore, the second semiconductor chips 320 and the third semiconductor chip 330 may be electrically connected through the third bump 335 and the metal line 230 to the first semiconductor chip 310 or the external terminals 150. A third under-fill pattern 430 may be provided in a fourth gap between the interposer substrate 200 and the third semiconductor chip 330, thereby encapsulating the third bump 335. The third under-fill pattern 430 may include a dielectric polymer, such as an epoxy-based polymer.

The molding layer 400 may be disposed on the package substrate 100, thereby covering sidewalls of the first semiconductor chip 310, sidewalls of the second semiconductor chips 320, and sidewalls of the third semiconductor chip 330. The molding layer 400 may expose a top surface of the first semiconductor chip 310 and top surfaces of the uppermost second semiconductor chips 320. Alternatively, the molding layer 400 may further cover the top surface of the first semiconductor chip 310 and the top surfaces of the uppermost second semiconductor chips 320. The molding layer 400 may include a dielectric polymer, such as an epoxy-based polymer.

The semiconductor package may further include a heat radiation plate 700. The heat radiation plate 700 may be disposed on at least one selected from the top surface of the first semiconductor chip 310 and the top surface of the uppermost second semiconductor chip 320. The heat radiation plate 700 may further cover a top surface of the molding layer 400. The heat radiation plate 700 may extend onto a sidewall of the molding layer 400. The heat radiation plate 700 may include a heat slug or a heat sink. The heat radiation plate 700 may include a material, such as metal, with high thermal conductivity.

The stiffener structure 500 may be disposed on the second region R2 of the package substrate 100. The stiffener structure 500 may not be provided on the first region R1 of the package substrate 100. The stiffener structure 500 may be disposed laterally spaced apart from the interposer substrate 200, the under-fill layer 240, the first semiconductor chip 310, the second semiconductor chips 320, the third semiconductor chip 330, and the molding layer 400. The stiffener structure 500 may have an inner sidewall 500c and an outer sidewall 500d that are opposite to each other. The inner sidewall 500c of the stiffener structure 500 may be directed toward and spaced apart from the interposer substrate 200. The stiffener structure 500 may include metal. For example, the stiffener structure 500 may include one or more of copper, stainless steels (SUS), aluminum silicon carbide (AlSiC), and titanium.

The stiffener structure 500 may have a relatively large stiffness. A Young's modulus may be employed to estimate a stiffness of a certain material. The stiffener structure 500 may have a Young's modulus of, for example, about 100 GPa to about 300 GPa. A difference in thermal expansion coefficient between components may induce warpage of the semiconductor package. As the stiffener structure 500 has a relatively large stiffness, the stiffener structure 500 may fix the second region R2 of the package substrate 100. Therefore, the package substrate 100 may be prevented from warpage. When the Young's modulus of the stiffener structure 500 is less than about 100 GPa, it may be difficult to sufficiently prevent warpage of the package substrate 100.

On the first region R1 of the package substrate 100, there may occur a difference in thermal expansion coefficient between the interposer bumps 250 and the package substrate 100. According to some example embodiments, the stiffener structure 500 may be disposed on the second region R2 of the package substrate 100. The stiffener structure 500 may have a thermal expansion coefficient different from that of the package substrate 100. For example, the stiffener structure 500 may have a thermal expansion coefficient greater than that of the package substrate 100. Therefore, the difference in thermal expansion coefficient between the package substrate 100 and the interposer bumps 250 on the first region R1 of the package substrate 100 may be counterbalanced with a difference in thermal expansion coefficient between the package substrate 100 and the stiffener structure 500 on the second region R2 of the package substrate 100. Accordingly, it may be possible to prevent warpage of the package substrate 100 or the interposer substrate 200.

According to some example embodiments, the stiffener structure 500 may have a hole 590. The hole 590 may penetrate a top surface 500a and a bottom surface 500b of the stiffener structure 500. The bottom surface 500b of the stiffener structure 500 may face the package substrate 100. The top surface 500a may be opposite to the bottom surface 500b of the stiffener structure 500. The hole 590 may be provided between the inner sidewall 500c and the outer sidewall 500d of the stiffener structure 500.

When the stiffener structure 500 does not have the hole 590, the stiffener structure 500 may apply stress to the package substrate 100 during an operation of the semiconductor package. The stress may occur due to a high stiffness of the stiffener structure 500. The stress may be concentrated on the first edge regions ER1 of the package substrate 100. When the semiconductor package operates repeatedly, the stress may generate a crack between the package substrate 100 and the under-fill layer 240. The crack may propagate toward the interposer bumps 250. In this case, a poor electrical connection may be provided between the package substrate 100 and at least one selected from the first, second, and third semiconductor chips 310, 320, and 330. An increase in overlapping area between the stiffener structure 500 and the package substrate 100 may induce an increase in occurrence of stress-induced cracks. According to some example embodiments, as the stiffener structure 500 has the hole 590, a reduced overlapping area may be provided between the stiffener structure 500 and the package substrate 100. When viewed in plan, the overlapping area may indicate an area where the bottom surface 500b of the stiffener structure 500 overlaps the package substrate 100. Therefore, it may be possible to reduce the stress applied to the package substrate 100 and to increase reliability of the semiconductor package.

According to some example embodiments, the hole 590 may be provided on one of the first edge regions ER1 of the package substrate 100. For example, the stiffener structure 500 may have a plurality of holes 590, and the plurality of holes 590 may overlap corresponding first edge regions ER1 of the package substrate 100. On each of the first edge regions ER1 of the package substrate 100, a reduced overlapping area may be provided between the stiffener structure 500 and the package substrate 100. By reducing the overlapping area, it may be possible to reduce the stress applied to the first edge regions ER1 of the package substrate 100 and to effectively reduce or avoid the occurrence of cracks between the package substrate 100 and the under-fill layer 240. Thus, the semiconductor package may increase in reliability. The following description will focus on a single hole 590.

An adhesive layer 600 may be provided on the second region R2 of the package substrate 100. The adhesive layer 600 may be interposed between the top surface of the package substrate 100 and the bottom surface 500b of the stiffener structure 500. The adhesive layer 600 may fix the stiffener structure 500 to the package substrate 100. As shown in FIG. 1C, the adhesive layer 600 may partially expose the bottom surface 500b of the stiffener structure 500. For example, the adhesive layer 600 may contact a portion of the bottom surface 500b of the stiffener structure 500. Alternatively, the adhesive layer 600 may completely cover the bottom surface 500b of the stiffener structure 500. The adhesive layer 600 may be provided in the hole 590 of the stiffener structure 500. For example, the adhesive layer 600 may extend onto a sidewall 590c of the hole 590, contacting the sidewall 590c of the hole 590. The adhesive layer 600 may fill at least a portion of the hole 590. For example, the adhesive layer 600 may fill a lower portion of the hole 590. The adhesive layer 600 may have an uppermost surface 600a located at a lower level than that of the top surface 500a of the stiffener structure 500. The uppermost surface 600a of the adhesive layer 600 may be located at a higher level than the bottom surface 500b of the stiffener structure 500.

The adhesive layer 600 may be relatively flexible. For example, the adhesive layer 600 may be more flexible than the stiffener structure 500. The adhesive layer 600 may have a relatively low stiffness. For example, the adhesive layer 600 may have a lower stiffness than that of the stiffener structure 500. A Young's modulus of the adhesive layer 600 may be about $\frac{1}{3000}$ to about $\frac{1}{10}$ of that of the stiffener structure 500. For example, the adhesive layer 600 may have a Young's modulus of about 0.01 GPa to about 1 GPa. As the adhesive layer 600 has a low stiffness and extends into the hole 590, the stress applied to the package substrate 100 may decrease. Accordingly, the semiconductor package may increase in reliability.

As shown in FIGS. 1A and 1B, the adhesive layer 600 may not be disposed on the first region R1 of the package substrate 100. The adhesive layer 600 may be spaced apart from the under-fill layer 240 and the interposer substrate 200, and may surround the under-fill layer 240 and the interposer substrate 200. The adhesive layer 600 may include a different material from that of the under-fill layer 240. The adhesive layer 600 may include a material different from that of the first, second, and third under-fill patterns 410, 420, and 430. Therefore, the adhesive layer 600 may have a stiffness different from that of the under-fill layer 240. As shown in FIG. 1C, the adhesive layer 600 may include a base layer 601, and the base layer 601 may include a silicone-based dielectric material. The silicone-based dielectric material may include, for example, a silicone-based polymer or a silicone-based rubber. The adhesive layer 600 may further include fillers 602. The fillers 602 may be provided in the base layer 601. For example, the fillers 602 may be distributed in the base layer 601. As the adhesive layer 600 further includes the fillers 602, the adhesive layer 600 may increase in mechanical strength. For example, the mechanical strength of the fillers 602 may be greater than that of the base layer 601. The fillers 602 may include a material different from that of the base layer 601. The fillers 602 may include an inorganic material. For example, the fillers 602 may include silicon oxide (SiOx) or aluminum oxide (AlOx), where x is a positive real number.

When the hole 590 has a width W2 less than about 50% of a width W1 of the stiffener structure 500, a stress-induced crack may occur between the package substrate 100 and the under-fill layer 240. When the width W2 of the hole 590 is greater than about 95% of the width W1 of the stiffener structure 500, the stiffener structure 500 may decrease in mechanical stability. According to some example embodiments, the width W2 of the hole 590 may be about 50% to about 95% of the width W1 of the stiffener structure 500. Therefore, the occurrence of cracks may decrease, and stability of the stiffener structure 500 may be secured. The width W2 of the hole 590 and the width W1 of the stiffener structure 500 may be measured at the bottom surface 500b of the stiffener structure 500. The width W1 of the stiffener structure 500 may correspond to an interval between the inner sidewall 500c and the outer sidewall 500d of the stiffener structure 500. The width W2 of the hole 590 may be measured in a direction the same as that in which is measured the corresponding width W1 of the stiffener structure 500.

The stiffener structure 500 may have a height H of about 0.2 mm to about 3.0 mm. The height H of the stiffener structure 500 may indicate an interval between the top surface 500a and the bottom surface 500b of the stiffener structure 500. When the height H of the stiffener structure 500 is less than about 0.2 mm, it may be insufficient that the stiffener structure 500 prevents warpage of the package substrate 100. When the height H of the stiffener structure 500 is greater than about 3.0 mm, it may be difficult to fabricate the semiconductor package and to achieve compactness of the semiconductor package.

Differently from that shown, it may be possible to omit at least one selected from the interposer substrate 200, the interposer bumps 250, the under-fill layer 240, the first semiconductor chip 310, the second semiconductor chips 320, the third semiconductor chips 330, the first under-fill pattern 410, the second under-fill pattern 420, the third under-fill pattern 430, the molding layer 400, the first bumps 315, the second bumps 325, and the third bumps 335. For example, the interposer substrate 200, the interposer bumps 250, and the under-fill layer 240 may be omitted, and the first semiconductor chip 310 and the third semiconductor chips 330 may be directly mounted on the package substrate 100. For example, when the first semiconductor chip 310 is directly mounted on the package substrate 100, the first bumps 315 may be directly coupled to corresponding substrate pads 120. When the third semiconductor chips 330 are directly mounted on the package substrate 100, the third bumps 335 may be directly coupled to corresponding substrate pads 120.

As another example, the interposer substrate 200, the interposer bumps 250, the under-fill layer 240, and the second and third semiconductor chips 320 and 330 may be omitted, and the first semiconductor chip 310 may be directly mounted on the package substrate 100. As another example, the first semiconductor chip 310, the first bumps 315, and the first under-fill pattern 410 may be omitted. As another example, the first semiconductor chip 310 and the interposer substrate 200 may be omitted, and the third semiconductor chip 330 may be directly mounted on the package substrate 100. As another example, the heat radiation plate 700 may be omitted. The number of the chip stacks of the first semiconductor chips 310 and of the second semiconductor chips 320 may be variously changed.

The following will describe an adhesive layer and a stiffener structure according to some example embodiments. A duplicate description discussed above will be omitted below.

Figure 2A:
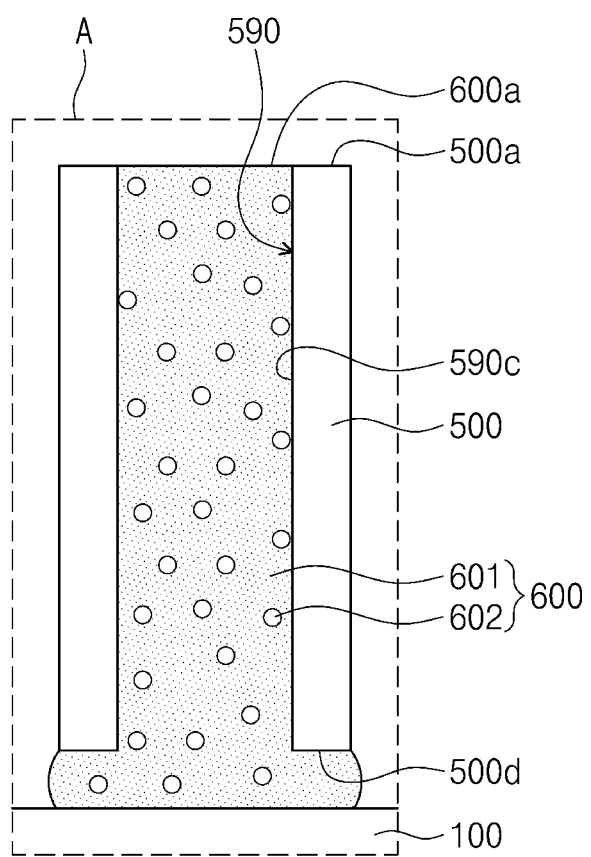
FIG. 2A illustrates a cross-sectional view showing an adhesive layer and a stiffener structure, according to example embodiments.
Figure 2B:
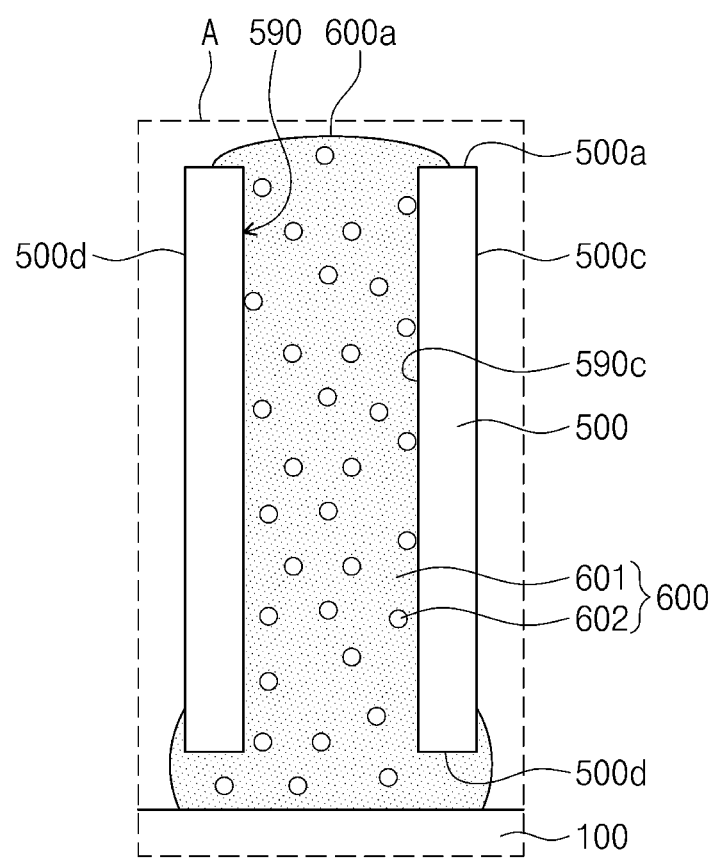
FIG. 2B illustrates a cross-sectional view showing an adhesive layer and a stiffener structure, according to example embodiments.

FIG. 2A illustrates an enlarged cross-sectional view of section A depicted in FIG. 1A, showing an adhesive layer and a stiffener structure according to some example embodiments. FIG. 2B illustrates an enlarged cross-sectional view of section A depicted in FIG. 1A, showing an adhesive layer and a stiffener structure according to some example embodiments. FIGS. 1A, 1B, and 1D will also be referred to in explaining FIGS. 2A and 2B.

Referring to FIGS. 2A and 2B, a semiconductor package may include a stiffener structure 500 and an adhesive layer 600. The stiffener structure 500 and the adhesive layer 600 may be substantially the same as those discussed above with reference to FIGS. 1A to 1D. For example, the stiffener structure 500 may have a hole 590 that penetrates the top surface 500a and the bottom surface 500b of the stiffener structure 500. The adhesive layer 600 may extend into the hole 590 of the stiffener structure 500 and may contact the sidewall 590c of the hole 590. A height and shape of the adhesive layer 600 may be variously changed.

As shown in FIG. 2A, the adhesive layer 600 may fill upper and lower portions of the hole 590. The uppermost surface 600a of the adhesive layer 600 may be located at substantially the same level as that of the top surface 500a of the stiffener structure 500. For example, the uppermost surface 600a of the adhesive layer 600 may be coplanar with the top surface 500a of the stiffener structure 500. The adhesive layer 600 may completely cover the bottom surface 500b of the stiffener structure 500, but the present inventive concepts are not limited thereto.

As shown in FIG. 2B, the adhesive layer 600 may fill the hole 590 of the stiffener structure 500 and may extend onto the top surface 500a of the stiffener structure 500. The adhesive layer 600 may further cover at least a portion of the top surface 500a of the stiffener structure 500. For example, the adhesive layer 600 may contact at least a portion of the top surface 500a of the stiffener structure 500. The uppermost surface 600a of the adhesive layer 600 may be located at a higher level than that of the top surface 500a of the stiffener structure 500. The adhesive layer 600 may cover the bottom surface 500b of the stiffener structure 500. The adhesive layer 600 may further cover a lower portion of the outer sidewall 500d and a lower portion of the inner sidewall 500c.

In figures other than FIGS. 1C, 2A, and 2B, neither the base layer 601 nor the fillers 602 are illustrated for convenience of drawing. This illustration, however, does not exclude the base layer 601 or the fillers 602.

The following will describe a hole of a stiffener structure.

Figure 3A:
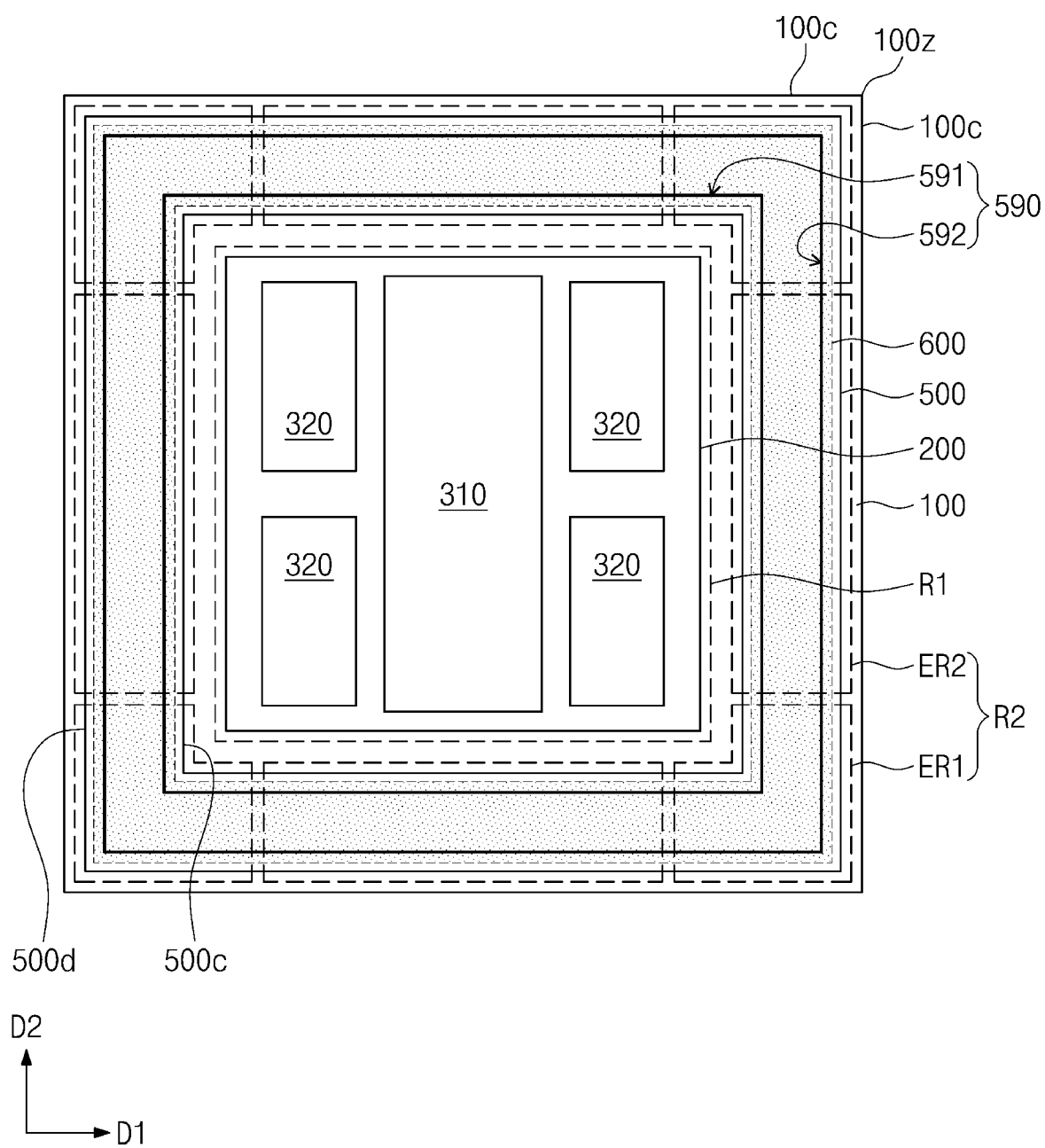
FIG. 3A illustrates a plan view showing a hole of a stiffener structure included in a semiconductor package, according to example embodiments.
Figure 3B:
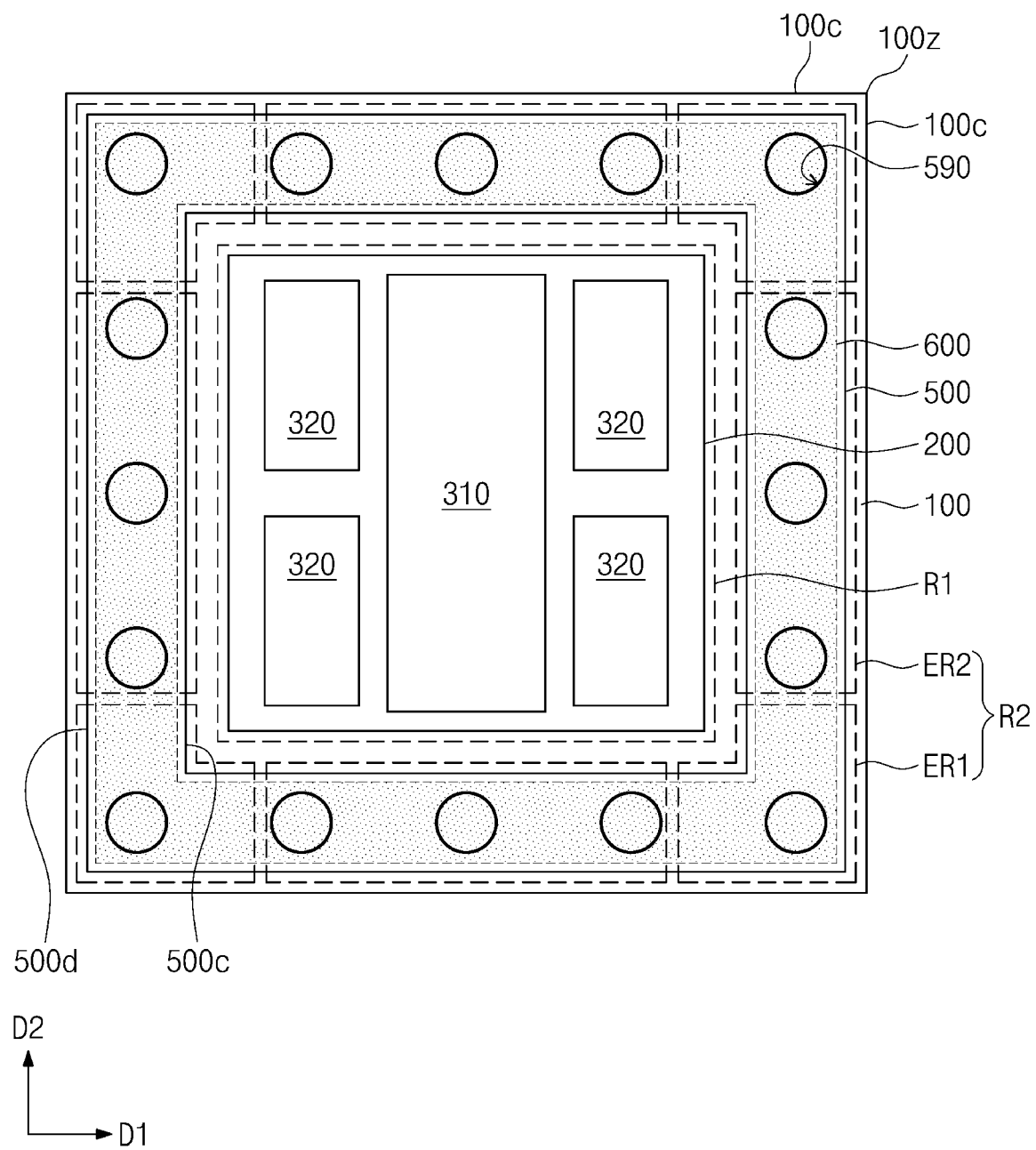
FIG. 3B illustrates a plan view showing a hole of a stiffener structure included in a semiconductor package, according to example embodiments.

FIG. 3A illustrates a plan view showing a hole of a stiffener structure included in a semiconductor package according to some example embodiments. FIG. 3B illustrates a plan view showing a hole of a stiffener structure included in a semiconductor package according to some example embodiments. FIGS. 1B to 1D will also be referred in explaining FIGS. 3A and 3B.

Referring to FIGS. 3A and 3B, the stiffener structure 500 may have a hole 590. The hole 590 may have a cross-section substantially the same as that discussed in the embodiment of FIGS. 1B to 1D. For example, the hole 590 may penetrate the stiffener structure 500. In contrast, the hole 590 may be disposed on the first edge regions ER1 and the second edge regions ER2 of the package substrate 100.

As shown in FIG. 3A, the stiffener structure 500 may have a single hole 590. When viewed in plan, the hole 590 may include first hole parts 591 and second hole parts 592. The first hole parts 591 may be parallel to a first direction D1. The first hole parts 591 may be spaced apart from each other in a second direction D2. The first direction D1 may be parallel to the top surface of the package substrate 100. The second direction D2 may be parallel to the top surface of the package substrate 100 and may intersect the first direction D1. The second hole parts 592 may be parallel to the second direction D2. The second hole parts 592 may be spaced apart from each other in the first direction D1. The second hole parts 592 may be spatially connected to corresponding first hole parts 591. The hole 590 may be a single hole in which the first hole parts 591 are connected to the second hole parts 592. The hole 590 may have, for example, a closed polygonal shape.

Referring to FIG. 3B, the stiffener structure 500 may have a plurality of holes 590. The holes 590 may be spaced apart from each other. Each of the holes 590 may have a circular shape. However, the shape of the hole 590 may be variously changed. For example, each of the holes 590 may have a tetragonal shape, a hexagonal shape, an octagonal shape, or any suitable polygonal shape. The presence of the holes 590 may relieve the stress applied to the first and second edge regions ER1 and ER2 of the package substrate 100.

Figure 4A:
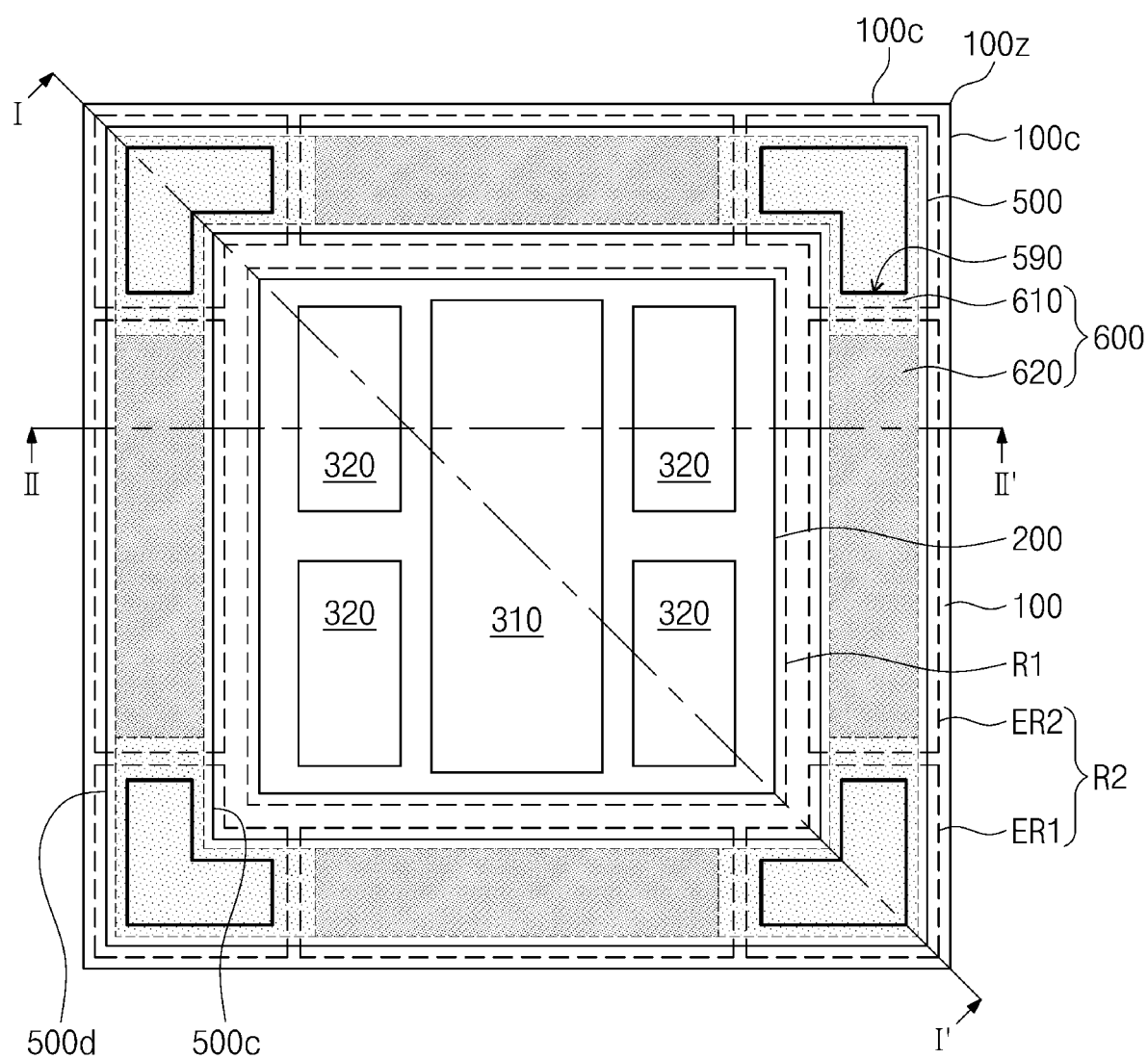
FIG. 4A illustrates a plan view showing a semiconductor package, according to example embodiments.
Figure 4B:
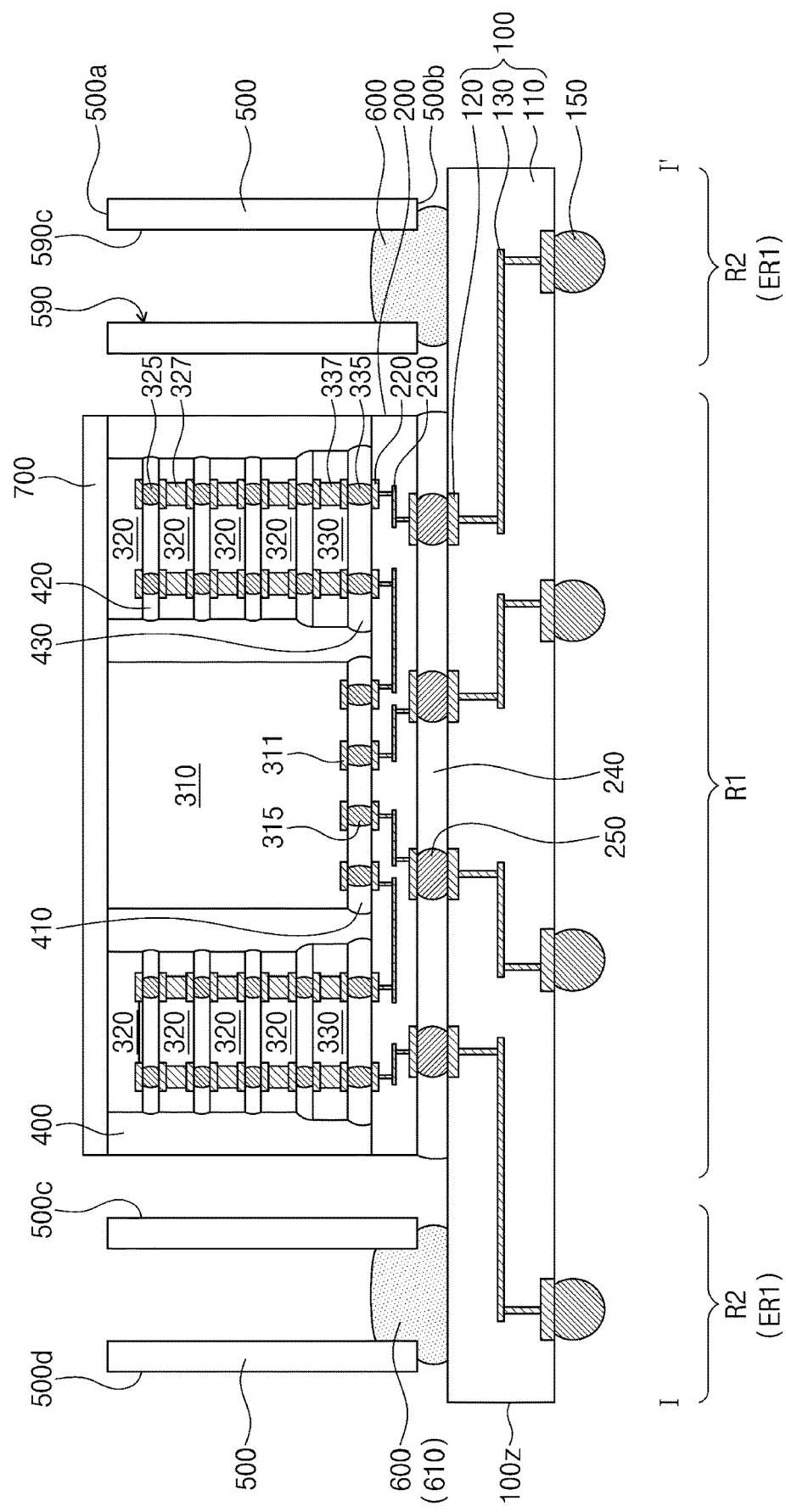
FIG. 4B illustrates a cross-sectional view taken along line IT of FIG. 4A.
Figure 4C:
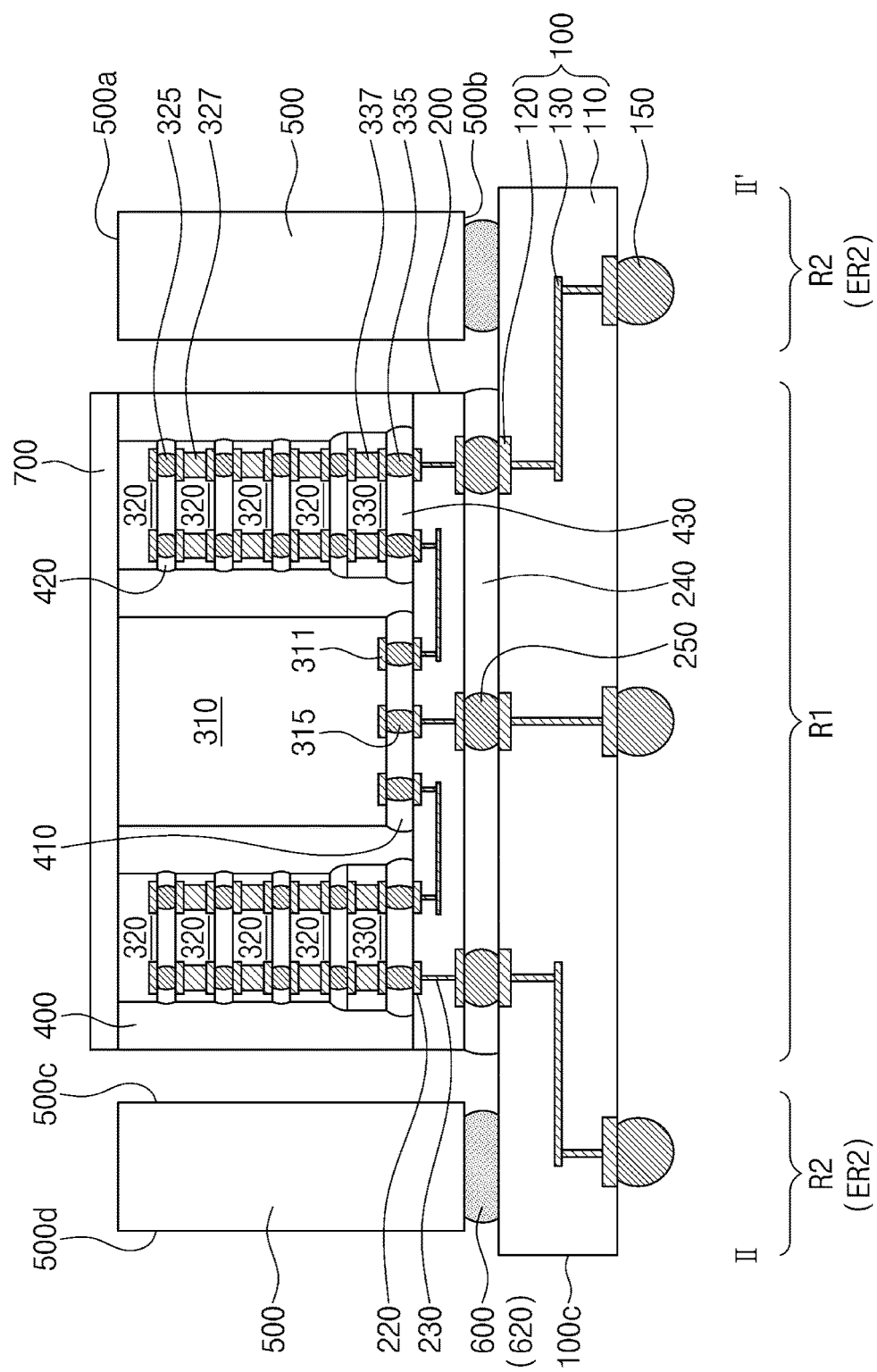
FIG. 4C illustrates a cross-sectional view taken along line II-IF of FIG. 4A.

FIG. 4A illustrates a plan view showing a semiconductor package according to some example embodiments. FIG. 4B illustrates a cross-sectional view taken along line I-I' of FIG. 4A. FIG. 4C illustrates a cross-sectional view taken along line II-IF of FIG. 4A. A duplicate description discussed above will be omitted below.

Referring to FIGS. 4A to 4C, a semiconductor package may include a package substrate 100, a first semiconductor chip 310, a stiffener structure 500, and an adhesive layer 600. The semiconductor package may further include at least one selected from external terminals 150, an interposer substrate 200, interposer bumps 250, an under-fill layer 240, second semiconductor chips 320, third semiconductor chips 330, first to third bumps 315, 325, and 335, first to third under-fill patterns 410, 420, and 430, a molding layer 400, and a heat radiation plate 700.

The stiffener structure 500 may be disposed on the first edge regions ER1 and the second edge regions ER2 of the package substrate 100. The stiffener structure 500 may have holes 590. When viewed in plan, the holes 590 may be provided on corresponding first edge regions ER1 of the package substrate 100.

The adhesive layer 600 may be interposed between the package substrate 100 and the stiffener structure 500. The adhesive layer 600 may include first adhesive layers 610 and second adhesive layers 620. When viewed in plan as shown in FIG. 4A, the first adhesive layers 610 may overlap corresponding first edge regions ER1 of the package substrate 100. When viewed in plan, the first adhesive layers 610 may overlap corresponding holes 590. As shown in FIG. 4B, each of the first adhesive layers 610 may extend into the corresponding hole 590. Each of the first adhesive layers 610 may cover the sidewall 590c of the corresponding hole 590. As shown in FIG. 4B, the first adhesive layer 610 may fill a lower portion of the hole 590. An uppermost surface of the first adhesive layer 610 may be located at a lower level than that of the top surface 500a of the stiffener structure 500. Alternatively, as discussed in the example of the adhesive layer 600 shown in FIG. 2A, the uppermost surface of the first adhesive layer 610 may be located at the same level as that of the top surface 500a of the stiffener structure 500. Alternatively, as discussed in the example of the adhesive layer 600 shown in FIG. 2B, the first adhesive layer 610 may cover the top surface 500a of the stiffener structure 500.

Each of the first adhesive layers 610 may include a material substantially the same as that discussed in the example of the adhesive layer 600 shown in FIGS. 1A to 1D. For example, each of the first adhesive layers 610 may include a base layer 601 as shown in FIG. 1C, and the base layer 601 may include a silicone-based polymer or a silicone-based rubber. Each of the first adhesive layers 610 may further include fillers 602, and the fillers 602 may include an inorganic material such as silicon oxide or aluminum oxide.

As shown in FIGS. 4A and 4C, the second adhesive layers 620 may overlap corresponding second edge regions ER2 of the package substrate 100. Each of the second adhesive layers 620 may be provided between the first adhesive layers 610. The second adhesive layers 620 may have their adhesive force greater than that of the first adhesive layers 610. Therefore, the second adhesive layers 620 may stably fix the stiffener structure 500 to the package substrate 100. The second adhesive layers 620 may have a material different from that of the first adhesive layers 610. The second adhesive layers 620 may include, for example, an epoxy-based polymer.

When the holes 590 are omitted from the stiffener structure 500, and when the adhesive layer 600 is omitted, a stress may be concentrated on the first edge regions ER1 of the package substrate 100. The second adhesive layers 620 may not be provided on the first edge regions ER1 of the package substrate 100. The adhesive layer 600 may be spaced apart from the hole 590 of the stiffener structure 500. The first adhesive layers 610 may have low stiffness and small Young's modulus. The Young's modulus of the first adhesive layers 610 may be less than that of the second adhesive layers 620. For example, the Young's modulus of the first adhesive layers 610 may be about 1/3000 to about 1/100 of that of the stiffener structure 500. For example, the first adhesive layers 610 may have a Young's modulus of about 0.01 GPa to about 1 GPa. As the first adhesive layers 610 extend into the holes 590 on the first edge regions ER1 of the package substrate 100, it may be possible to reduce the stress applied to the first edge regions ER1 of the package substrate 100 and to effectively reduce or avoid the occurrence of cracks between the package substrate 100 and the under-fill layer 240. Thus, the semiconductor package may increase in reliability.

The package substrate 100, the first to third semiconductor chips 310, 320, and 330, the external terminals 150, the interposer substrate 200, the under-fill layer 240, the first to third bumps 315, 325, and 335, the first to third under-fill patterns 410, 420, and 430, the molding layer 400, and the heat radiation plate 700 may be substantially the same as those discussed above in the embodiment of FIGS. 1A to 1D.

Figure 5:
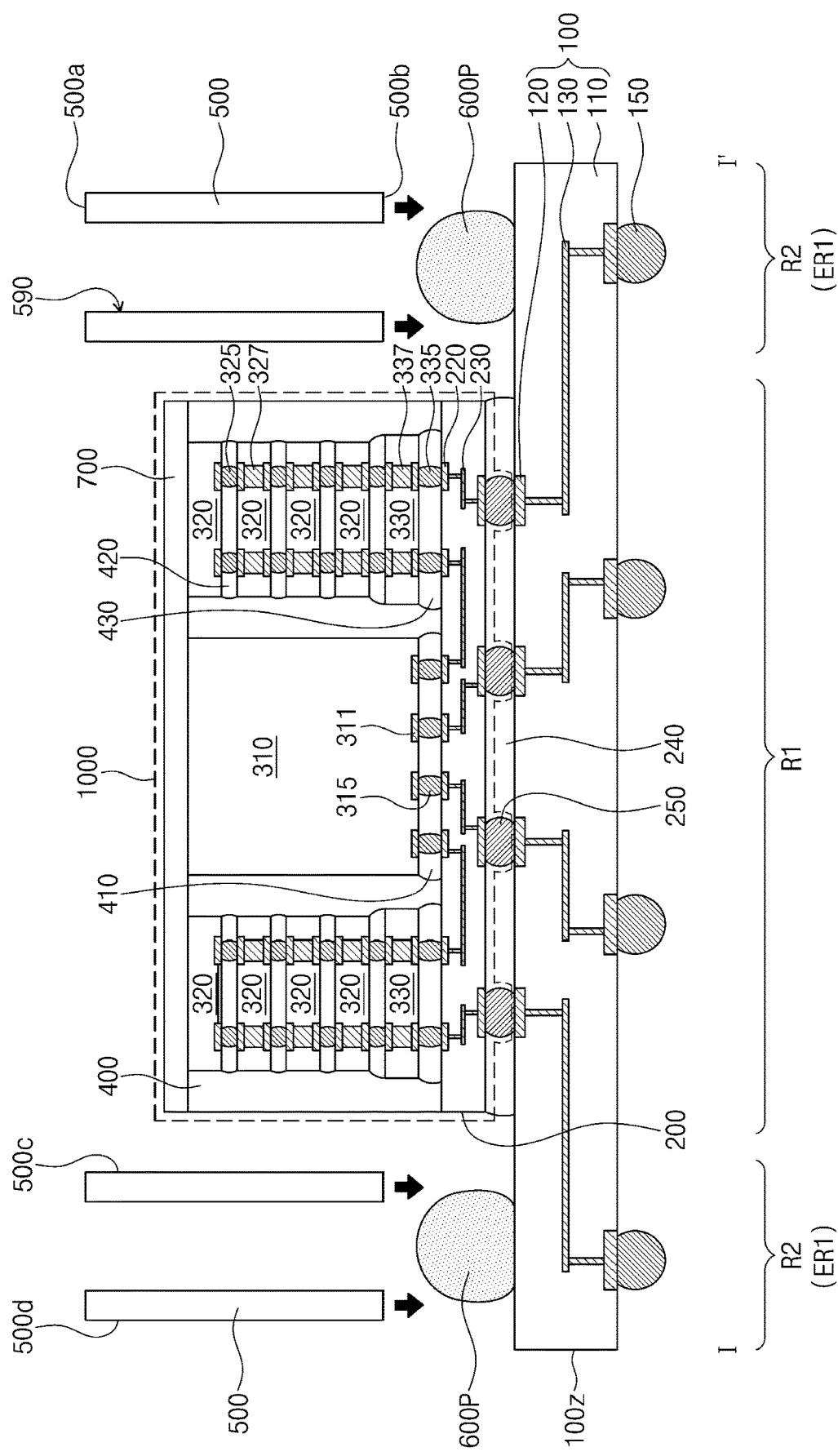
FIG. 5 illustrates a cross-sectional view showing a method of fabricating a semiconductor package, according to example embodiments.

FIG. 5 illustrates a cross-sectional view taken along line I-I' of FIG. 1A, showing a method of fabricating a semiconductor package according to some example embodiments. A duplicate description discussed above will be omitted below.

Referring to FIG. 5, a preliminary package 1000 may be prepared. The preliminary package 1000 may include an interposer substrate 200, interposer bumps 250, a first semiconductor chip 310, second semiconductor chips 320, and third semiconductor chips 330. The interposer bumps 250 may be provided on a bottom surface of the interposer substrate 200. The preliminary package 1000 may further include first to third bumps 315, 325, and 335, first to third under-fill patterns 410, 420, and 430, a molding layer 400, and a heat radiation plate 700.

The preliminary package 1000 may be mounted on a package substrate 100. The mounting of the preliminary package 100 may include placing the preliminary package 1000 on a first region R1 of the package substrate 100 and coupling the interposer bumps 250 to a plurality of substrate pads 120. Afterwards, an under-fill layer 240 may be formed between the package substrate 100 and the interposer substrate 200, thereby encapsulating the interposer bumps 250.

A preliminary adhesive layer 600P may be formed on a second region R2 of the package substrate 100. The formation of the preliminary adhesive layer 600P may be performed by a dispensing process of an adhesive material. The preliminary adhesive layer 600P may not be coated on the first region R1 of the package substrate 100. The formation of the under-fill layer 240 may be followed by the formation of the preliminary adhesive layer 600P.

A stiffener structure 500 may be prepared which has a hole 590. The stiffener structure 500 may be disposed on a top surface of the second region R2 of the package substrate 100 so as to allow a bottom surface 500b of the stiffener structure 500 to face the preliminary adhesive layer 600P. In this case, the hole 590 of the stiffener structure 500 may vertically overlap the preliminary adhesive layer 600P.

Referring to FIGS. 5 and 1B, the stiffener structure 500 may descend to allow its bottom surface 500b to contact the preliminary adhesive layer 600P. A physical force, such as pressure, may be applied to the stiffener structure 500. The stiffener structure 500 may compress the preliminary adhesive layer 600P. The preliminary adhesive layer 600P may be in contact with the bottom surface 500b of the stiffener structure 500, and at least a portion of the preliminary adhesive layer 600P may be introduced into the hole 590 to thereby form an adhesive layer 600. The adhesive layer 600 may cover a sidewall 590c of the hole 590, and may contact at least a portion of the bottom surface 500b of the stiffener structure 500 and the top surface of the package substrate 100. The adhesive layer 600 may fix the stiffener structure 500 onto the top surface of the second region R2 of the package substrate 100. Accordingly, a semiconductor package may be eventually fabricated as shown in FIGS. 1A to 1D.

An arrangement relationship between the stiffener structure 500 and the adhesive layer 600 may be variously changed depending on a volume of the deposited preliminary adhesive layer 600P, a height of the stiffener structure 500, and a width of the hole 590. For example, the stiffener structure 500 and the adhesive layer 600 may be substantially the same as those discussed in the embodiment of FIG. 2A or 2B.

The embodiment of FIGS. 1A to 1D, the embodiment of FIG. 2A, the embodiment of FIG. 3A, and the embodiment of FIG. 3B may be combined with each other. For example, when the hole 590 has a planar shape as discussed in the embodiment of FIG. 3A or 3B, the hole 590 may be provided therein with the adhesive layer 600 that is disposed as discussed in the embodiment of FIG. 1C, 2A, or 2B.

According to the present inventive concepts, a stiffener structure may be disposed on edge regions of a package substrate, and thus it may be possible to reduce or avoid warpage of the package substrate. As the stiffener structure has a hole, an overlapping area between the stiffener structure and the package substrate may be reduced. Therefore, a stress applied to the package substrate may decrease. An adhesive layer may be provided in the hole and may have a low stiffness. Accordingly, the stress applied to the package substrate may further decrease. As a result, a semiconductor package may increase in reliability.

This detailed description of the present inventive concepts should not be construed as limited to the embodiments set forth herein, and it is intended that the present inventive concepts cover the various combinations, the modifications and variations of this invention without departing from the spirit and scope of the present inventive concepts.

What is claimed is:

1. A semiconductor package, comprising:
    a package substrate;
    a chip substrate on the package substrate;
    a first semiconductor chip mounted on the chip substrate;
    a stiffener structure on the package substrate, the stiffener structure having a hole; and
    an adhesive layer between the package substrate and the stiffener structure, an uppermost surface of the adhesive layer being equal to or lower than a top surface of the stiffener structure,
    wherein the adhesive layer comprises a base layer and a plurality of oxide fillers in the base layer,
    wherein the stiffener structure is laterally spaced apart from the chip substrate,
    wherein the package substrate comprises a plurality of first edge regions, each first edge region comprising a corner connecting two adjacent side surfaces of the package substrate, and a plurality of second edge regions, each second edge region positioned between a pair of the first edge regions and extending adjacent to the side surface of the package substrate,
    wherein the hole penetrates the top surface of the stiffener structure and a bottom surface of the stiffener structure, the bottom surface being nearer to the package substrate than the top surface,
    wherein, when viewed in plan, the hole overlaps one of the plurality of first edge regions, and the hole is positioned on a line that extends between the corner of the package substrate and a corner of the chip substrate adjacent to the corner of the package substrate.

2. The semiconductor package of claim 1, wherein the adhesive layer extends into the hole of the stiffener structure and covers at least a portion of a sidewall of the hole.

3. The semiconductor package of claim 2, wherein the adhesive layer has a stiffness less than a stiffness of the stiffener structure.

4. The semiconductor package of claim 3, wherein a Young's modulus of the adhesive layer is about $\frac{1}{3000}$ to about $\frac{1}{100}$ of a Young's modulus of the stiffener structure.

5. The semiconductor package of claim 4,
    wherein the Young's modulus of the adhesive layer ranges from about 0.01 GPa to about 1 GPa, and
    wherein the Young's modulus of the stiffener structure ranges from about 100 GPa to about 300 GPa.

6. The semiconductor package of claim 1, further comprising:
    a plurality of second semiconductor chips stacked on the chip substrate,
    wherein the first semiconductor chip is of a different type of chip than the plurality of second semiconductor chips.

7. The semiconductor package of claim 1, wherein the base layer includes a silicone-based polymer or a silicone-based rubber.

8. The semiconductor package of claim 7, wherein the oxide fillers include a material different from a material of the base layer.

9. The semiconductor package of claim 1, further comprising:
a plurality of interposer bumps interposed between and electrically connected to the package substrate and the chip substrate; and
an under-fill layer in a gap between the package substrate and the chip substrate, the under-fill layer encapsulating the interposer bumps,
wherein the adhesive layer is spaced apart from the under-fill layer and includes a material different from a material of the under-fill layer.

10. The semiconductor package of claim 1,
wherein the package substrate has a central region and an edge region that surrounds the central region, when viewed in plan,
wherein the edge region comprises the plurality of first edge regions and the plurality of second edge regions,
wherein the chip substrate is on the central region of the package substrate, and
wherein the stiffener structure is on the edge region of the package substrate.

11. The semiconductor package of claim 1, wherein a width of the hole is about 50% to about 95% of a width of the stiffener structure.

12. The semiconductor package of claim 1, wherein the oxide fillers comprise silicon oxide (SiOx) or aluminum oxide (AlOx), where x is a positive real number.

13. The semiconductor package of claim 1, comprising a heat radiation plate disposed on a top surface of the first semiconductor chip, wherein the stiffener structure is laterally spaced apart from the heat radiation plate.

14. A semiconductor package, comprising:
a package substrate having a first region and a second region that surrounds the first region, when viewed in plan;
a first semiconductor chip on the first region of the package substrate;
an interposer substrate between the package substrate and the first semiconductor chip;
a stiffener structure on the second region of the package substrate, the stiffener structure having a hole; and
an adhesive layer between the package substrate and the stiffener structure,
wherein the second region of the package substrate comprises a plurality of first edge regions, each first edge region comprising a corner connecting two adjacent side surfaces of the package substrate, and a plurality of second edge regions, each second edge region positioned between a pair of the first edge regions and extending adjacent to the side surface of the package substrate,
wherein the hole penetrates a top surface of the stiffener structure and a bottom surface of the stiffener structure,
wherein the adhesive layer extends into the hole of the stiffener structure,
wherein, when viewed in plan, the hole overlaps one of the plurality of first edge regions, and the hole is positioned on a line that extends between the corner of the package substrate and a corner of the interposer substrate adjacent to the corner of the package substrate,
wherein the adhesive layer comprises a base layer and a plurality of oxide fillers in the base layer, and
wherein an uppermost surface of the adhesive layer with respect to the package substrate is equal to or lower than an uppermost surface of the stiffener structure with respect to the package substrate.

15. The semiconductor package of claim 14, wherein a Young's modulus of the adhesive layer is less than a young's modulus of the stiffener structure.

16. The semiconductor package of claim 14, wherein a width of the hole is about 50% to about 95% of a width of the stiffener structure.

17. The semiconductor package of claim 14, further comprising:
a second semiconductor chip mounted on the interposer substrate and laterally spaced apart from the first semiconductor chip.

18. A semiconductor package, comprising:
a package substrate having a first region and a second region that surrounds the first region, when viewed in plan;
a first semiconductor chip on the first region of the package substrate;
an interposer substrate between the package substrate and the first semiconductor chip;
a stiffener structure on the second region of the package substrate, the stiffener structure having a hole; and
an adhesive layer between the package substrate and the stiffener structure, an uppermost surface of the adhesive layer being equal to or lower than a top surface of the stiffener structure,
wherein the second region of the package substrate comprises a plurality of first edge regions, each first edge region comprising a corner connecting two adjacent side surfaces of the package substrate, and a plurality of second edge regions, each second edge region positioned between a pair of the first edge regions and extending adjacent to the side surface of the package substrate,
wherein the hole penetrates the top surface of the stiffener structure and a bottom surface of the stiffener structure, the bottom surface being nearer to the package substrate than the top surface,
wherein, when viewed in plan, the hole overlaps one of the plurality of first edge regions, and the hole is positioned on a line that extends between the corner of the package substrate and a corner of the interposer substrate adjacent to the corner of the package substrate,
wherein the adhesive layer comprises a base layer and a plurality of oxide fillers in the base layer, and
wherein the adhesive layer extends into the hole of the stiffener structure.

19. The semiconductor package of claim 18, wherein a width of the hole is about 50% to about 95% of a width of the stiffener structure.

* * * * *